United States Patent [19]
Yoshizawa et al.

[11] 3,943,497
[45] Mar. 9, 1976

[54] SPLIT COIL TYPE BUBBLE DOMAIN DRIVING APPARATUS

[75] Inventors: Shigeru Yoshizawa, Kodaira; Nobuo Saito, Mitaka; Itsuo Mikami, Kodaira; Gen-ichi Kamoshita, Koganei, all of Japan

[73] Assignee: Hitachi, Ltd., Japan

[22] Filed: June 27, 1972

[21] Appl. No.: 268,185

[30] Foreign Application Priority Data
June 30, 1971  Japan.............................. 46-48328

[52] U.S. Cl..................... 340/174 TF; 340/174 TB
[51] Int. Cl.²................... G11C 11/14; G11C 8/00
[58] Field of Search .... 340/174 TF, 174 M, 174 TB

[56] References Cited
UNITED STATES PATENTS

| | | | |
|---|---|---|---|
| 2,917,727 | 12/1959 | Reach, Jr. ..................... | 340/174 M |
| 3,534,347 | 10/1970 | Bobeck ......................... | 340/174 TF |
| 3,543,252 | 11/1970 | Perneski....................... | 340/174 TF |
| 3,703,712 | 11/1972 | Bobeck et al................. | 340/174 TF |
| 3,711,838 | 1/1973 | Kefalas......................... | 340/174 TF |

*Primary Examiner*—Stanley M. Urynowicz, Jr.
*Attorney, Agent, or Firm*—Craig & Antonelli

[57] ABSTRACT

A bubble domain driving apparatus is provided in which a large memory device with a storage capacity of 256 megabits, for example, is divided into 64 smaller memory elements, each thereof comprising one or plurality of thin magnetic film strips for bubble domain, and each of the 4-megabit smaller memory elements is provided with its own coils for applying in the plane thereof bubble domain driving rotating fields with the coils adapted to be selectively energized.

5 Claims, 5 Drawing Figures

U.S. Patent  March 9, 1976  3,943,497
FIG. 1b  FIG. 1a
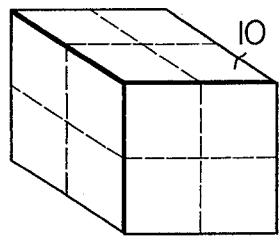
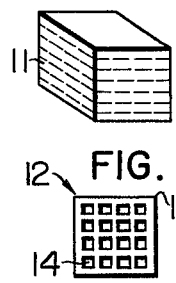
FIG. 1c
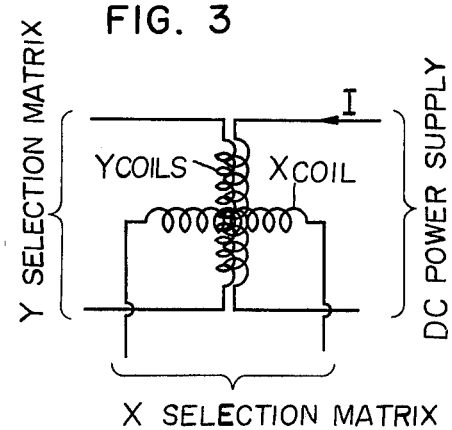
FIG. 3
FIG. 2
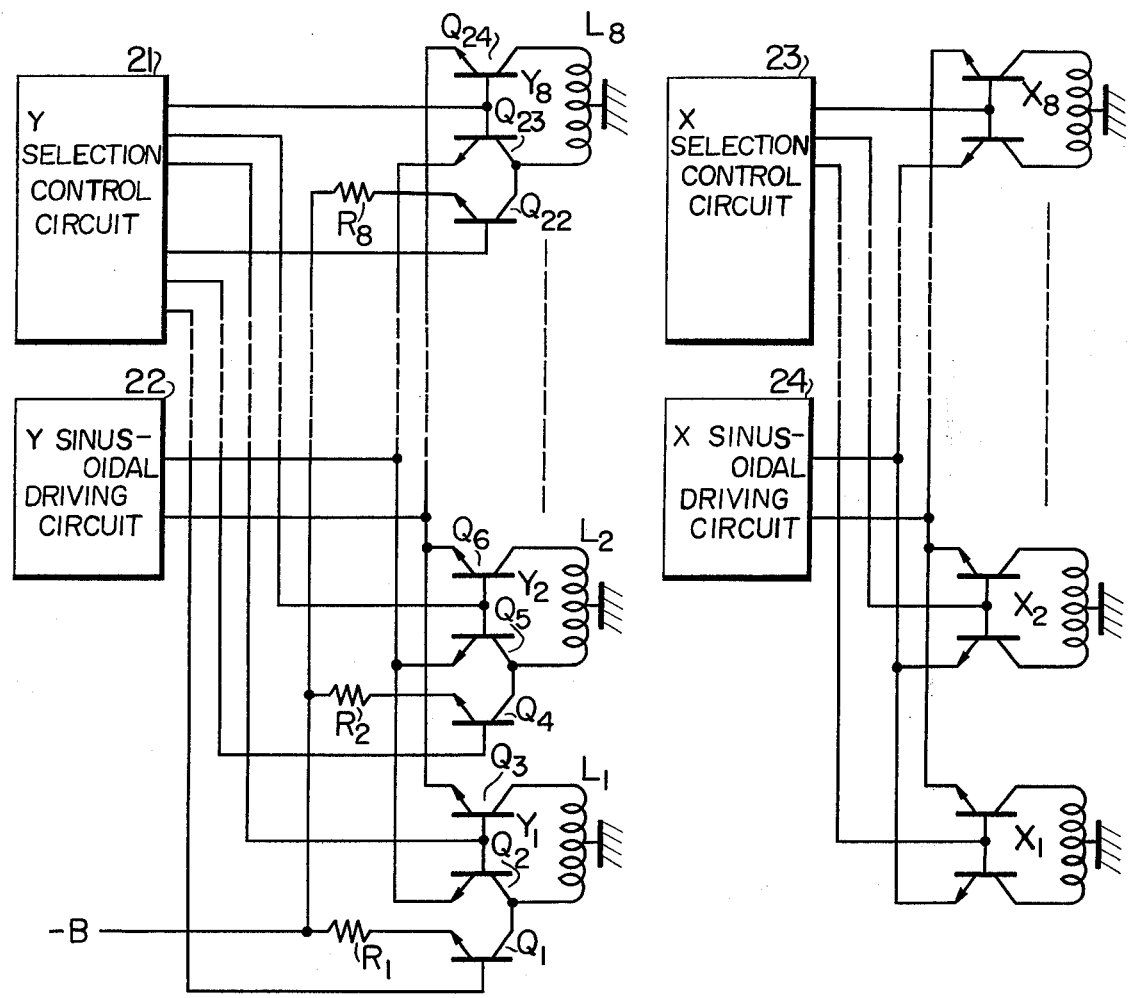

SPLIT COIL TYPE BUBBLE DOMAIN DRIVING APPARATUS

BACKGROUND OF THE INVENTION

1. Field of the Invention

The present invention relates to a large capacity bubble domain memory device comprising a large number of memory planes each thereof carrying a thin magnetic film for bubble domain and, on top of it, deposited thin ferromagnetic films of T-BAR, Y-BAR, etc. patterns, and more particularly to a rotating field driving apparatus for applying rotating fields in the plane of the thin magnetic film for bubble domain so as to transfer the bubble domains over the pattern formed on the memory plane by the thin ferromagnetic film.

2. Description of the Prior Art

Bubble domain memory devices which have been hitherto proposed generally comprise a memory element of a substantially cubical shape consisting of a plurality of planes each thereof carrying deposited thin ferromagnetic films on top of a thin magnetic film for bubble domain and coils wound on the memory element to apply a field in each of the three directions of the respective planes, i.e., the transversal or X direction, the longitudinal or Y direction and the vertical or Z direction. The memory planes used in such prior art devices consist, for example, of deposited T-BAR permalloy films placed on a large bubble domain magnetic film of about 2.5 centimeter square. Another construction of the memory plane consists of deposited T-BAR permalloy films placed on a large number of small bubble domain thin magnetic film pieces of 2 to 10 mm² and these thin magnetic film pieces are mounted on an insulating substrate such as a ceramic substrate of about 5 cm². The field applied in the Z direction is a biasing field of a predetermined magnitude which is employed to produce bubble domains in the bubble domain thin magnetic film pieces. This biasing field may be applied by a permanent magnet. The X and Y fields are rotating in-plane fields which vary sinusoidally with a 90° phase difference therebetween or their modified forms which vary in a pulse-like or sawtoothwave-like manner, and the fields rotate through 360°.

While large capacity bubble domain memory devices of the type constructed as described have been proposed, no driving methods have been disclosed for such memory devices due to the elements being of recent discovery. It is known that the energy of a magnetostatic field is proportional to its cubic volume and the impedance of a coil is proportional to a driving frequency. Thus, there is naturally an upper limit to the magnitude of a frequency at which a memory element of great volume can be driven.

If it is assumed that a uniform field H is applied in a cubical space with the sides $a$ and the flux is totally produced by a coil having N turns, then the voltage E applied to the coil is given by the following equation (1):

$$E = N \frac{d\phi}{dt} = N \cdot a^2 \frac{dB}{dt} \qquad (1)$$

where $\phi$ is the total flux and B is the flux density. If it is also assumed that the magnetomotive force NI of the coil is wholly acting on the cube, then we obtain:

$$NI = H \cdot a \qquad 2$$

$$B = \mu_o H \qquad 3$$

Then from the equations (1) to (3), we obtain:

$$E = \frac{H \cdot a}{I} \cdot a^2 \cdot \mu_o \frac{dH}{dt} \qquad (4)$$

Therefore $$E \cdot I = \mu_o a^3 \cdot H \cdot \frac{dH}{dt} \qquad (5)$$

Now assume that the following relations hold:

$$\left. \begin{array}{l} H = H_R \sin \omega t \\ I = I_R \sin \omega t \\ E = E_R \cos \omega t \end{array} \right\} \qquad 6$$

Then the equation (5) is rewritten as:

$$E_R \cdot I_R = \mu_o \cdot a^3 \cdot \omega H_R^2 \qquad 7$$

Therefore, as the sum of the coil current $I_R$ in the memory element and the peak value of voltage $E_R$ is proportional to the volume $a^3$, frequency $f (= \omega/2\pi)$ and the square of field $H_R^2$, it is evident that an upper limit is naturally set on the value of frequency at which a bulky memory element can be driven.

SUMMARY OF THE INVENTION

To meet the foregoing requirements, the present invention contemplates to divide a memory element into a plurality of smaller elements and provide each of the smaller memory elements with its own coils to thereby facilitate the driving of large capacity memory devices.

It is therefore a principal object of the present invention to provide a bubble domain driving apparatus of a simple construction which is designed for driving large capacity memory devices.

It is another object of the present invention to provide a bubble domain driving apparatus in which bubble domain driving rotating fields are applied in the plane of magnetic films only when a memory-refer is made, thereby reducing the total power consumption to a very low level.

It is a further object of the present invention to provide a bubble domain driving apparatus which is simple and inexpensive to manufacture.

In accordance with these and other objects, the apparatus according to the present invention includes separate coil means for each of a plurality of memory elements each comprising one or plurality of bubble domain thin magnetic film strips so that bubble domain driving rotating fields are applied in the plane of the thin magnetic film strips. The apparatus of the present invention further includes selection circuitry for selecting a given one of the plurality of coil means and driving circuitry for energizing the selected coil means.

In accomplishing the above objects, the inventors conducted various experiments and constructed a memory stack having a cubic volume of $64 \times 10^{-6}$ m$^3$ ($a = 4$ cm) employing garnet to provide bubble domains whose diameter is 5 $\mu$m. By applying magnetic field $H_R$ of 20 oerstead of approximately $1.6 \times 10^3$ AT/m (Amper Turn) to the memory stack, the inventors could obtain a large memory device having a memory capacity of 32 megabits. If, however, the bubble domains in this memory stack were driven at a frequency of 1MHz, then from the equation (7) the power required would be given as:

$$E_r \cdot I_r = 1460 \text{ V·A}$$

In other words, a rotating field generating coil used for driving such a memory stack must be such that a load voltage of 73 V is generated if for example a current of 20 A is supplied. That is, a bubble domain driving apparatus is required which withstands the load current of 20 A and the load voltage of 73 V. If a current of 5A is used, then the required withstand voltage must be not less than 292 V. It is difficult to manufacture a high frequency driving apparatus with such a large withstand voltage and, if not impossible, the apparatus would become too bulky and expensive to prohibit its application in practical use.

Not all of 32 megabits of the 32-megabit memory device are read or written at all times, but only a part of these bits are read or written at a time. If, therefore, the memory element is divided for example into 8 smaller memory elements each having a size of 2 cm$^2$ ($a = 2$ cm) and each of the smaller memory elements is provided with its own coil means so that a given one of the separate coil means is selected and energized solely, the power required would be reduced to one eighth, i.e., 183 V·A. This therefore permits the use of driving circuitry having a withstand voltage of 92 V 2A or 46 V 4A, for example, thereby solving the foregoing difficulty.

The effectiveness of the present invention may be enhanced as the storage capacity of a memory device is increased. For example, if the sides $a$ of the memory element is increased to 8 cm producing a large memory device having a storage capacity of 256 megabits and if this memory device is driven at a frequency of 5 MHz, then from the equation (7) the power required would be given as:

$$E_r \cdot I_r = 58.4 \text{ KV·A}$$

In other words, the power required would be 40 times as much as that which is required for driving the 32-megabit memory device. The withstand voltage of a driving apparatus for driving the bubble domains in this memory device must have an exceedingly large value of 584 V 100A, for example. The manufacture of such a driving apparatus is practically impossible. The withstand voltage of the driving apparatus can be effectively reduced, however, if a memory element with such a large capacity is divided into 64 smaller memory elements each having the side length $a$ of 2 cm and if each smaller memory element is provided with its own coil means so that a given one of the coil means is selected and energized as previously mentioned. If this large memory is divided into 64 smaller memory elements, from the equation (7), the withstand voltage of the driving apparatus can be 92 V 2A or 46 V 4A, for example.

In a large memory device, as previously mentioned, not all of the bits are always read or written, but only a very small part of them at a time. Therefore, to divide a large memory element into a plurality of smaller memory elements is effective not only in simplifying the driving circuitry and reducing its manufacturing cost, but also in reducing the total power consumption.

Generally, the application of a vertical biasing field in a bubble domain memory element produces stable bubble domains without the application of rotating fields. Therefore, if rotating fields are applied only when a read or write operation is to be effected, the stand-by power supply required, excepting during read and write operations, can be advantageously reduced to a value just sufficient to provide the biasing field. In this case, however, rotating in-plane fields tend to magnetize the thin film layer of permalloy producing local fields at the magnetized film portions which tend to vary the biasing field. It is thus necessary that when the rotating fields are removed, their values are maintained in terms of a DC current so as to ensure a wider margin of operation.

On the other hand, if the fields applied in the X and Y directions respectively consist for example of fields which are out of phase with each other and which vary sinusoidally, the time of terminating the fields or the current supply should preferably be selected so that the current supply is cut off when the current flow in either one of the X and Y field generating coils has dropped to zero (at this time, the current flow in the other coil is at the maximum). In this case, the X and Y driving currents may be simultaneously cut off so that the rotating fields can be maintained in terms of the corresponding DC current with one of the driving currents being at zero and the other at the maximum value. Alternately, the current supply to one of the two coils may be cut off when the current flow in this coil has dropped to zero and the current supply to the other coil may be cut off when the current flow therein has been subsequently reduced to zero, thereby holding the rotating fields in terms of the corresponding DC current with both of the X and Y coil currents being at zero.

Furthermore, the arrangement of the present invention in which rotating fields are applied only during read and write operations has an additional advantage over the conventional arrangements in which rotating fields are always applied. That is, if the memory is used as a block oriented random access memory, a reduced access time can be realized since the position of the first bit in any data is always fixed.

In a split type memory element of the type described above, the information stored in the unselected smaller memory elements must be maintained without applying any rotating fields and thus this type of arrangement also possesses naturally the advantages which result from the fact that rotating fields are applied only during read and write operations.

BRIEF DESCRIPTION OF THE DRAWING

FIGS. 1A through 1C schematically illustrate a memory element employed in an embodiment of the present invention.

FIG. 2 is a schematic diagram showing a bubble domain driving apparatus used with the memory element shown in FIG. 1.

FIG. 3 is a schematic diagram showing a bubble domain driving coil used in another embodiment of the present invention.

DESCRIPTION OF THE PREFERRED EMBODIMENTS

Referring first to FIG. 1, there is schematically illustrated a memory element which is employed in an embodiment of the present invention. FIG. 1 a shows a large memory element 10. FIG. 1 b shows one of 8 smaller memory elements divided from the large memory element 10 according to the present invention. FIG. 1 c shows a single plane 12. The plane 12 comprises a ceramic substrate 13 of 2 cm² having deposited thereon T-bar permalloy circuitry, control conductor loops, sensing elements and their leads and, on top of these, a plurality of thin bubble domain magnetic film strips of 4 mm² which are stacked and spaced away from one another at regular distances. The smaller memory element 11 shown in FIG. 1 b comprises eight planes 12 stacked on top of each other at a pitch of 2 mm, selection circuitry of the memory loops disposed on the upper and lower sides of the planes and amplifiers for output signals.

According to the present invention, the smaller memory element 11 is provided with coils would therearound to apply a uniform field in the X, Y and Z directions respectively of the element 11. A large 32-megabit memory element is composed of eight smaller memory elements 11. Referring now to FIG. 2, there is illustrated a bubble domain driving apparatus for the above-mentioned large 32-megabit memory device. As already mentioned, rotating fields magnetize the thin film of permalloy so that the resultant local fields at the magnetized thin film portions tend to cause variation in the biasing field. It is therefore preferable that the values of the rotating fields, when removed, be maintained in terms of the corresponding DC current so as to achieve a wider margin of operation. In the present embodiment, therefore, sinusoidal currents which are different in phase are supplied as the X and Y coil currents and the time at which the current supply is cut off is selected such that the current supply is cut off when the X coil current is at zero and the Y coil current is at the maximum value. Returning to FIG. 2, designated as $Y_1, Y_2, \ldots, Y_8$ are switch circuits (first Y switch circuits) for selecting the coils provided for each of the eight smaller memory elements 11. The switch circuit $Y_1$ is composed of transistors $Q_2$ and $Q_3$ whose bases are directly connected to each other. A transistor $Q_1$ is a transistor saturation circuit (second Y switch circuit) which is provided to supply a DC current to the Y coil upon the removal of the rotating fields. This switch circuit is not necessarily essential for the apparatus. The emitter of the transistor $Q_1$ is connected to a DC power supply-B through a resistor $R_1$ and its collector is directly connected to the collector of the transistor $Q_2$. The junction point of the collectors of the transistors $Q_1$ and $Q_2$ is connected to one end of a Y coil $L_1$ whose the other end is connected to the collector of the transistor $Q_3$. The remaining Y coils $L_2, L_3, \ldots, L_8$ are similarly connected to the switch circuits $Y_2, Y_3, \ldots, Y_8$, respectively. Numeral 21 designates a Y coil selection control circuit for controlling the operation of the switch circuits to select a desired Y coil; 22 a Y sinusoidal driving circuit for supplying a sinusoidal current to the Y coils. The junction point between the bases of the transistors $Q_2$ and $Q_3$ in the switch circuit $Y_1$ is connected to the Y coil selection control circuit 21 and the emitters of these transistors are connected to the Y sinusoidal driving circuit 22. The base of the transistor $Q_1$ is connected to the Y coil selection control circuit 21. When the Y coil $L_1$ is selected so that the sinusoidal current is supplied to the coil $L_1$, the transistor $Q_1$ is cut off. When the Y coil $L_1$ is de-energized cutting off the supply of sinusoidal current to the coil $L_1$, the base voltage of the transistor $Q_1$ is varied by a signal from the control circuit 21 thus rendering the transistor $Q_1$ conductive. When this occurs, a DC current is supplied to the coil $L_1$. The magnitude of this DC current is equal to the maximum value of the sinusoidal current supplied to the X and Y coils. The base potentials of the transistors $Q_2$ and $Q_3$ and the base potential of the transistor $Q_7$ are changed in the opposite direction with respect to each other. The other Y coils $L_2, L_3, \ldots, L_8$ are controlled in exactly the same manner.

Designated as $X_1, X_2, \ldots, X_8$ are switch circuits (first X switch circuits) for selecting the X coils provided for each of the eight smaller memory elements. The switch circuits $X_1$ to $X_8$ are identical in construction with the switch circuits $Y_1$ to $Y_8$ which select the Y coils.

With the arrangement described above, the present invention can be effectively carried out with minimum selection circuitry and driving circuitry whose capacity is one eighth of that which is required to drive a memory element of 4 centimeter cube as a whole. In addition, the driving power consumption can also be reduced to about one eighth.

In FIG. 3, there is shown a modified form of the bubble domain driving coils shown in FIG. 2. In the illustrated arrangement, the Y coil consists of two coils so that the sinusoidal current is selectively supplied to one (first coil) of the two coils and a DC current is continuously supplied to the other coil (second coil). If a coil of this type is employed, there is no need to use the transistor saturation switches $Q_1, Q_4, \ldots, Q_{22}$ employed in the embodiment of FIG. 2. This further simplifies the bubble domain driving apparatus of the present invention.

We claim:

1. A split coil type bubble domain driving apparatus comprising: a plurality of memory elements each consisting of at least one magnetic film for a bubble domain; a plurality of rotating in-plane field generating coil means provided one for each of said plurality of memory elements to apply bubble domain driving rotating fields in the plane of said memory element, each of said plurality of coil means consisting of an X coil and a Y coil for applying magnetic fields perpendicular to each other in the same plane of said memory plane; first driving means for supplying an alternating current to said rotating in-plane field generating coil means; and first selection means connected between said first driving means and said rotating in-plane field generating coil means for selecting a given one of said plurality of rotating in-plane field generating coil means in response to a memory request, whereby said alternating current from said first driving means is applied only to the rotating in-plane field generating coil means selected by said first selection means.

2. A split coil type bubble domain driving apparatus according to claim 1, wherein said first selection means comprises a plurality of first switch circuits each provided for one of said plurality of rotating in-plane field generating coil means, each of said plurality of first switch circuits being connected between one of said plurality of rotating in-plane field generating coil means and said first driving means, and a control circuit for selecting a given one of said plurality of switch circuits in response to a memory request.

3. A split coil type bubble driving apparatus according to claim 2, further including second driving means for supplying a direct current to said plurality of rotating in-plane field generating coil means, and a plurality of second switch circuits connected between said second driving means and said plurality of rotating in-plane field generating coil means, whereby said second switch circuit are selectively controlled by said control circuit to select said rotating in-plane field generating coil means unselected by said first switch circuits.

4. A split coil type bubble domain driving apparatus according to claim 1, further including second driving means for supplying a direct current to said plurality of rotating in-plane field generating coil means, wherein either each of said plurality of X coils or each of said plurality of Y coils is divided into a first coil connected to said first driving means through said first selection means and a second coil directly connected to said second driving means.

5. A split coil type bubble domain driving apparatus according to claim 4, wherein said first selection means comprises a plurality of first switch circuits connected between said plurality of rotating in-plane field generating coil means and said first driving means, and a control circuit for selecting a given one of said plurality of first switch circuits in response to a memory request.

* * * * *